(12) United States Patent
Yokoyama et al.

(10) Patent No.: US 6,744,318 B2
(45) Date of Patent: Jun. 1, 2004

(54) DIGITAL POWER AMPLIFIER

(75) Inventors: Kenji Yokoyama, Tokyo (JP); Yasuo Yamada, Hamamatsu (JP)

(73) Assignee: Flying Mole Corporation, Hamamatsu (JP)

( * ) Notice: Subject to any disclaimer, the term of this patent is extended or adjusted under 35 U.S.C. 154(b) by 0 days.

(21) Appl. No.: 10/167,452

(22) Filed: Jun. 13, 2002

(65) Prior Publication Data

US 2002/0190792 A1 Dec. 19, 2002

(30) Foreign Application Priority Data

Jun. 19, 2001 (JP) ........................................ 2001-184285

(51) Int. Cl.[7] .............................................. H03F 3/217
(52) U.S. Cl. ...................... 330/251; 330/59; 330/207 A
(58) Field of Search ........................ 330/10, 59, 207 A, 330/251

(56) References Cited

U.S. PATENT DOCUMENTS

| | | | |
|---|---|---|---|
| 3,383,613 A | 5/1968 | Novak | 330/271 |
| 3,808,545 A | 4/1974 | Stanley | 330/265 |
| 6,563,377 B2 * | 5/2003 | Butler | 330/10 |

* cited by examiner

*Primary Examiner*—Steven J. Mottola
(74) *Attorney, Agent, or Firm*—Oliff & Berridge, PLC

(57) ABSTRACT

A digital power amplifier has a reduced size, high output, high efficiency and low power consumption. Electrical isolation is provided between input and output sections by a photo-coupler on a transmission passage for turning into a digital signal.

6 Claims, 4 Drawing Sheets

DIGITAL POWER AMPLIFIER

BACKGROUND OF THE INVENTION

1. Technical Field of the Invention

This invention relates to digital power amplifiers and, more particularly, to a digital power amplifier suited for apparatus size reduction.

2. Description of the Related Art

In recent years, rapid progress has being made in digitalizing the amplifiers for power amplification. Particularly, real adoptions are conspicuous in the audio amplifiers. The appliances mounted with digital power amplifiers (so-called switching amplifiers) include DVD players, mini-compo stereo sets, television receivers, personal computers and so on. Furthermore, considerations are given also toward the adoption to the cellular phones under functional improvement.

This is to cope with the requirement of reducing the size or consumption power in the audio amplifiers having increased by the functional improvement in these appliances, On the other hand, the digital power amplifier using the conventional±power source avoids the increase in the charging voltage to the power-source capacitor by a regenerative current on a low-pass filter (LPF) coil. In order to secure a stable operation in a low range having increasing regenerative current, there is a need for a chemical capacitor to have a large capacitance.

The chemical capacitor has a capacitance value directly involved in the low-range reproduction capability, and has generally an increased volume. This has been a factor to inhibit against the size and cost reduction of the apparatus.

FIG. 4 is a block diagram showing a configuration of a 1-bit digital power amplifier of a conventional scheme configuring output unit by a single power source. In this configuration, a signal processing circuit 101 compares an analog voice signal with a triangular wave inputted to an inverted input terminal (−). Namely, the analog voice signal is converted, with the triangle wave as a threshold, into a 1-bit digital signal. The converted digital signal is supplied to a driver of a switching section 105, to control the opening and closing of switches SW1, SW2, SW3 and SW4. The current, supplied from a power source (E) 109 of a power source section 107, flows in a direction passing the switch SW1, the load 111 and the switch SW3 or in a direction passing the switch SW4, the load 111 and the switch SW2. The load 111 is supplied with a digital alternating-current power, i.e. so-called a BTL connection. In this operation, concerning the affection of a regenerative current due to an LPF coil, because the charge to one capacitor and the discharge to a load are alternately done, capacitor voltage increase can be avoided. In this configuration, however, because load output is not grounded, there is a disadvantage that restricted are a plurality of connections with loads and appliances.

Meanwhile, the impossible output grounding is a serious defect of a DC output amplifier and power source.

However, high output, high efficiency and low power consumption are sought by the size-reduction and functional improvement in cellular phones, together with further size reduction toward digital audio amplifiers.

The present invention has been made in view of the foregoing problem. The problem lies in that the output can be grounded with a single power source, in order to provide a digital power amplifier making possible high output, high efficiency and low power consumption together with the size reduction in the digital audio amplifier.

SUMMARY OF THE INVENTION

Electrical isolation is provided between input and output sections by a photo-coupler on a transmission passage for turning into a digital signal. This enables a BTL output to be grounded.

In order to achieve the foregoing object, various exemplary embodiments according to the present invention provide: four switches SW1, SW2, SW3 and SW4 connected in an annular form; a load connecting section provided between a connection point of adjacent switches SW1 and SW2 and a connection point of adjacent switches SW3 and SW4 to connect a load; a power source connecting section provided between a connection point of adjacent switches SW1 and SW4 and the connection point of adjacent switches SW2 and SW3 to apply a voltage; a grounding section grounding the connection point of the adjacent switches SW3 and SW4; signal processing unit for converting an input signal into a 4-line digital signal; driving unit for controlling opening-and-closing drive of the switches SW1, SW2, SW3 and SW4 according to a digital signal supplied from the signal processing unit; isolating unit for electrically isolating between the signal processing unit and the driving unit; and feed-back unit for feeding back a signal at the connection point of the adjacent switches SW1 and SW2 to the signal processing unit.

In the invention, of the four switches annularly connected, a load connecting section is provided between the connection point of adjacent switches SW1 and SW2 and the connection point of adjacent switches SW3 and SW4, to provide here a load such as a speaker. Meanwhile, a voltage, e.g. E, is applied to a power source connecting section provided between the connection point of adjacent switches SW1 and SW4 and the connection point of adjacent switches SW2 and SW3. Also, electrical isolation is provided between the signal processing unit for converting an input analog signal and digital signal into a 4-line digital signal and the driving unit for controlling opening-and-closing drive of the switches SW1, SW2, SW3 and SW4 according to a digital signal supplied from the signal processing unit. On the other hand, the connection point of the adjacent switches SW3 and SW4 is grounded, a signal at the connection point of the electrically-isolated switches SW1 and SW2 to be fed back to the signal processing unit is enabled.

In various exemplary embodiments according to the invention, the isolating unit is a photo-coupler.

In this invention, the photo-coupler is used to once convert an electric signal into a light signal and furthermore into an electric signal, thereby completely electrically isolate between the signal processing unit and the driving unit.

In various exemplary embodiments according to the invention, the digital power amplifier is provided with a resistance having a value smaller than the load in series with the load connecting section, and changed to a constant-current-output digital power amplifier for feeding back a current flowing the load to an input side, a plurality of which are connected in parallel with one another.

In this invention, the digital power amplifiers in plurality are connected in parallel with one another thereby making them possible to supply a power having a magnitude multiple times in accordance with the number thereof.

In various exemplary embodiments according to the invention, the constant-current-output digital power amplifiers are connected at inputs and outputs into parallel connection, an input amplifier being provided in front of an input section of the parallel connection to feed back a voltage at an output section of the parallel connection to an entirety.

DETAILED DESCRIPTION OF THE PREFERRED EMBODIMENTS

The embodiments of the present invention will now be explained with reference to the drawings.

Figure 1:
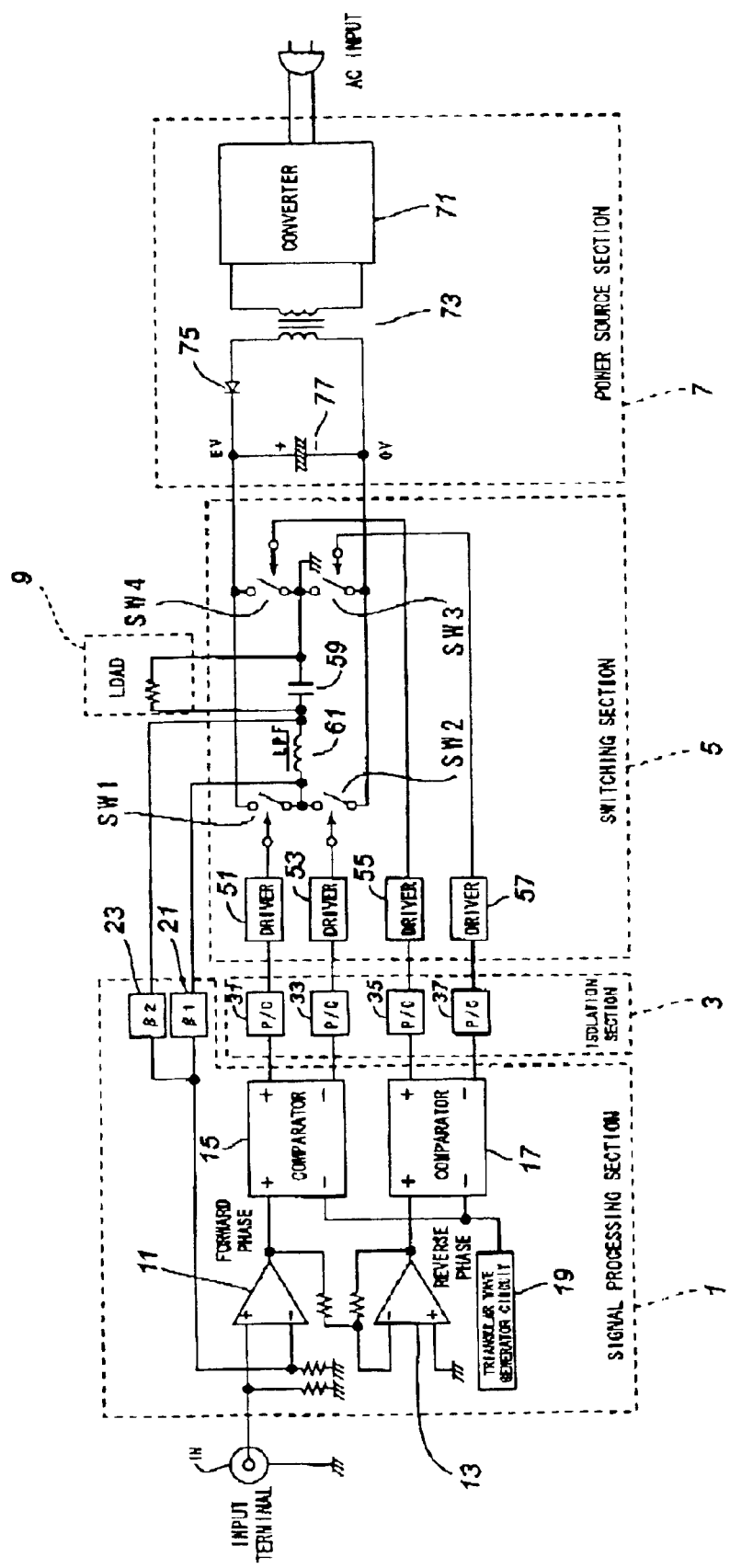
FIG. 1 is a block diagram showing a schematic configuration of an embodiment of a digital power amplifier according to the present invention.

FIG. 1 is a block diagram showing a configuration of a digital power amplifier according to an embodiment of the invention. The digital power amplifier shown in the figure is configured with a signal processing section 1 as signal processing unit, an isolation section 3 as isolating unit, a switching section 5, a power source section 7 and a load 9.

Referring to FIG. 1, the switching section 5 has four switches SW1, SW2, SW3 and SW4 made by semiconductor switching elements, such as MOS-FETs, for switching at high speed and annularly connected counterclockwise in the order. These switches SW1, SW2, SW3 and SW4 are respectively controlled for opening and closing by the drivers 51, 53, 55 and 57 to be operated according to a digital signal from a signal processing section 1, hereinafter referred.

A load 9 is connected to a load connecting section between a connection point of adjacent switches SW1 and SW2 and a connection point of adjacent switches SW3 and SW4. A voltage EV, supplied from the power source section 7, is applied to a power-supply connecting section between a connection point of adjacent switches SW1 and SW4 and a connection point of adjacent switches SW2 and SW3. An LPF (low pass filter) capacitor 59 is connected in parallel with the load 9 while an LPF (low pass filter) coil 61 is connected in series with the load 9. This removes radio-frequency component noises.

Meanwhile, the adjacent switches SW3 and SW4 have a connection point being grounded. The signal, at the connection point of the switches SW1 and SW2 (on a side connected to the LPF coil 61), is fed back to the signal processing section 1 through a constant generating section 21. The signal, between the LPF coil 61 and the load, is similarly fed back to the signal processing section 1 (inverted input terminal (−) of an operational amplifier 11, hereinafter referred) through a constant generating section 23.

The signal processing section 1 is configured including operational amplifiers 11, 13, comparators 15, 17, a triangular wave generator circuit 19 and constant generating sections 21, 23.

At first, an analog signal inputted at an input terminal IN is inputted to a non-inverted input terminal (+) of the operational amplifier 11. The operational amplifier 11 has an output to be inputted to an inverted input terminal (−) of the operational amplifier 13 through a resistance, and to a non-inverted input terminal (+) of the comparator 15. Meanwhile, the operational amplifier 13 has an output (reverse phase to the output of the operational amplifier 11) to be inputted to a non-inverted input terminal (+) of the comparator 17, and fed back to an inverted input terminal (−) of the operational amplifier 13 itself through a resistance.

Meanwhile, the comparators 15, 17 at their respective inverted input terminals (−) are connected with a triangular wave generator circuit 19, to be supplied with a triangular wave with a predetermined period. Due to this, comparison is made between the analog voice signals respectively inputted to the non-inverted input terminals (+) of the comparators 15, 17 and the triangular wave inputted to the inverted input terminal (−) thereof. Namely, the analog voice signals are converted into digital signals by the triangular wave as a threshold. The converted digital signals are supplied to the drivers 51, 53, 55 and 57 of the switching section 5 through the photo-couplers 31, 33, 35 and 37 of the isolation section 3.

Incidentally, in this case, there is inversion (reverse phase) between the output signal at the non-inverted output terminal (+) of the comparator 15 and the output signal the an inverted output terminal (−) thereof. Also, there is inversion (reverse phase) between the output signal at the non-inverted output terminal (+) of the comparator 17 and the output signal at the inverted output terminal (−) thereof. Accordingly, the output signal at the non-inverted output terminal (+) of the comparator 15 is in phase with the output signal at the non-inverted output terminal (−) of the comparator 17. Namely, the signal processing section 1 controls to synchronously open and close the switches SW1 and SW3, and the switches SW2 and SW4, respectively.

Herein, the operation principle of the embodiment will be explained with reference to FIG. 2.

Figure 2:
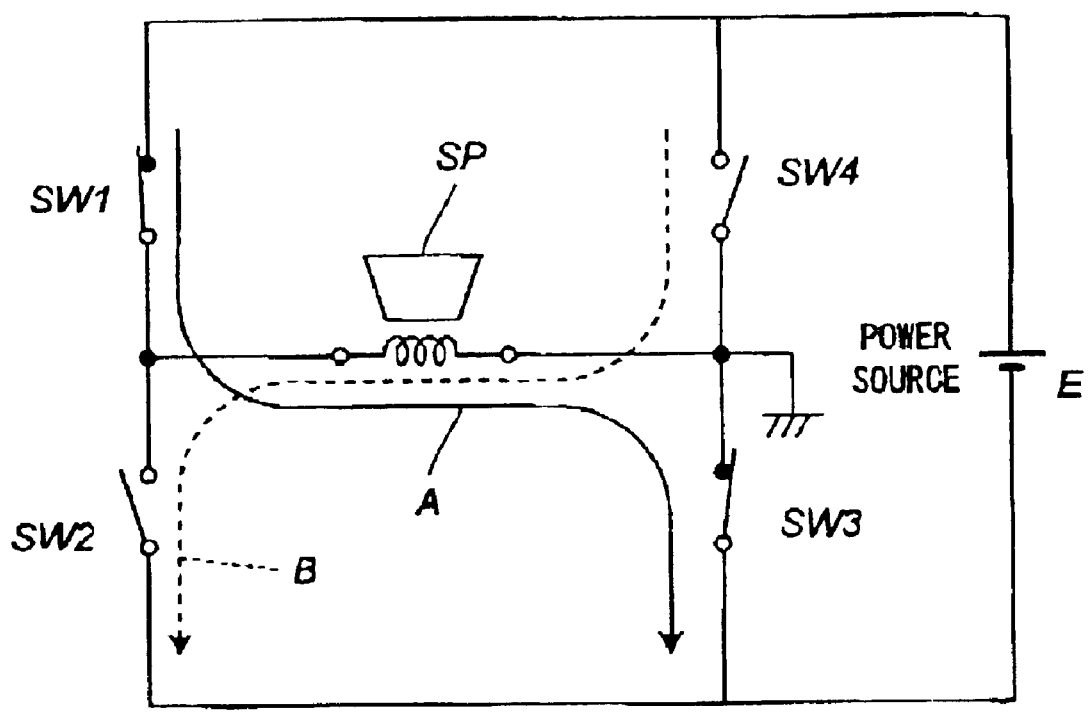
FIG. 2 is a circuit diagram for explaining an operation principle of an essential part shown in FIG. 1.

FIG. 2 shows a state that the switches SW1 and SW3 are closed and the switches SW2 and SW4 are opened. In such a state, the current supplied from the power source (E) flows in a solid-lined direction through the switch SW1, the load (speaker SP) and the switch SW3, to supply a digital power to the load. Meanwhile, when conversely the switches SW2 and SW4 are closed and the switch SW1 and SW3 are opened, a current flow in a dotted-lined direction through the switch SW4, the load and the switch SW2, to supply an alternate current output of digital power, such as a voice signal, to the load.

The isolation section 3 is configured with photo-couplers (P/C). This is an isolation circuit electrically isolating between the signal processing section 1 and the switching section 5.

An output amplifier, at its one end, can be grounded by the floating circuit. The power source section 7 is configured with a converter 71 for AC-DC conversion, a transformer 73 for isolation between the power source side and the device side, a diode 75 for stabilizing a direct current and a chemical capacitor 77. Due to this, the power source section 7 functions as a direct-current voltage source which inputs, for example, an alternating current 100V, lowers the voltage thereof down to a predetermined voltage, and converts it into a direct current of E(V) for an output.

The load 9, in this embodiment, is explained for a case of a speaker. This may be, for example, an output section of a communicator, a direct-current motor in a machine tool or a high-output laser diode.

The efficiency of power source utilization can be improved by grounding one end of the load. Furthermore, by connecting a plurality of loads, ±DC output control is enabled with a single power source.

The operation of the present embodiment will now be explained.

First, an analog voice signal inputted at the input terminal IN is inputted to the non-inverted input terminal (+) of the operational amplifier 11. The output of the operational amplifier 11 is inputted to the inverted input terminal (−) of the operational amplifier 13 through a resistance, and to the non-inverted input terminal (+) of the comparator 15.

The analog voice signal, inputted to the non-inverted input terminal (+) of the comparator 15, is compared with a triangular wave inputted to the inverted input terminal (−) of the same comparator 15 and converted into a digital signal with a threshold of the triangular wave. The converted digital signal is supplied to the drivers 51 and 53 of the switching section 5 through the photo-couplers 31, 33 of the isolation section 3.

The drivers 51 and 53 respectively drive to open and close the switches SW1 and SW2. In this case, the switches SW3 and SW4 are similarly driven to open and close. For example, when the switch SW1 is in a open state, the switch SW3 is also in an open state and the switches SW2 and SW4 are in a closed state. Consequently, a current flows in a direction of the switch SW4, the load 9 and the switch SW2. In the next instance, responsive to an inversion in the digital signal, the switches SW1 and SW3 turns into a closed state while the switches SW2 and SW4 are in an open state. Thus, a current flows in a direction of the switch SW1, the load 9 and the switch SW3.

In this manner, a current flows to the speaker as a load 9, causing a sound in accordance with the digital signal. Meanwhile, the signal in this case is fed back to the inverted input terminal (−) of the operational amplifier 11.

Figure 3:
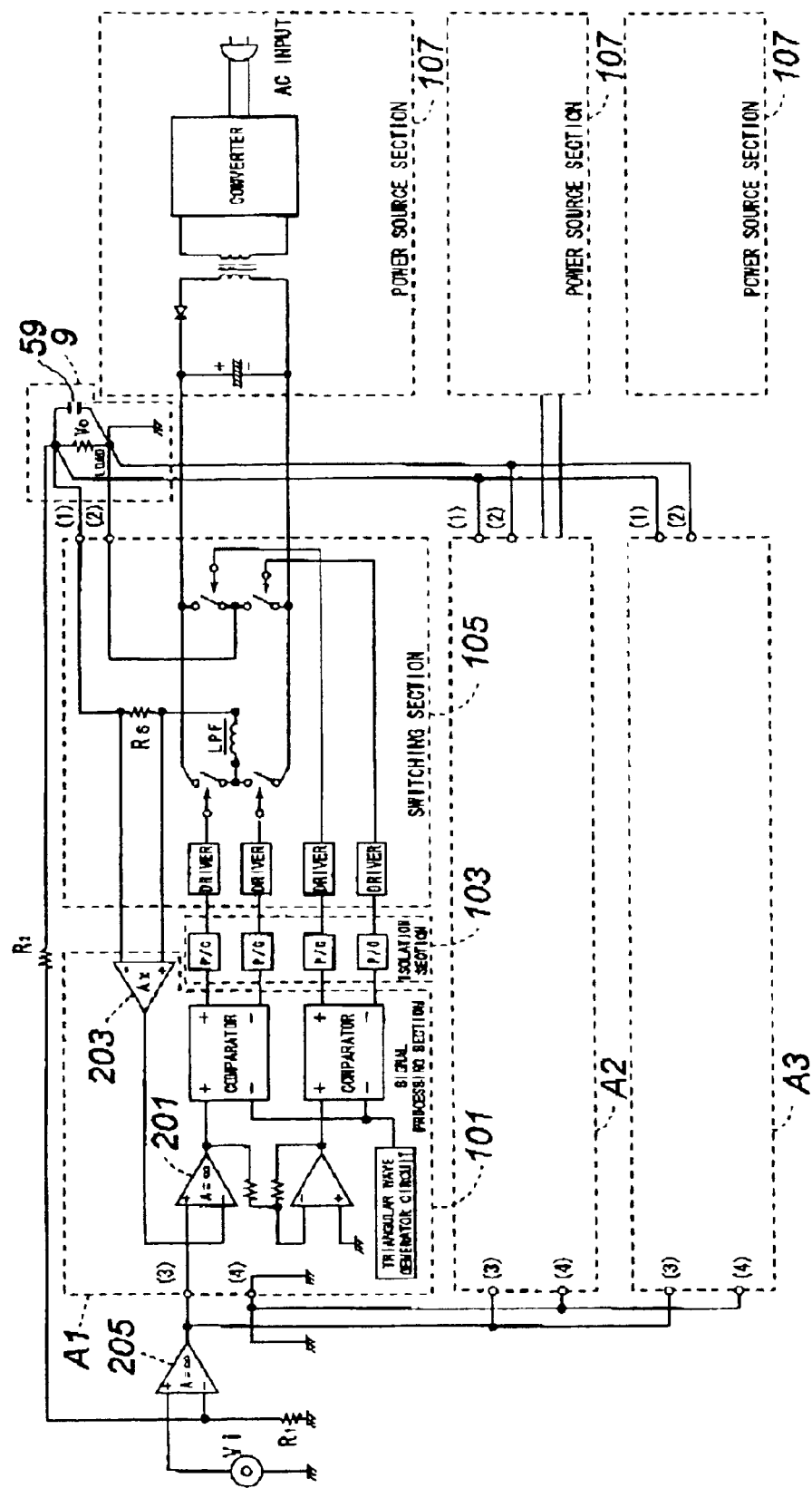
FIG. 3 is a block diagram showing a configuration of a high-output type digital power amplifier arranged with a plurality of the digital power amplifiers shown in FIG. 1.
Figure 4:
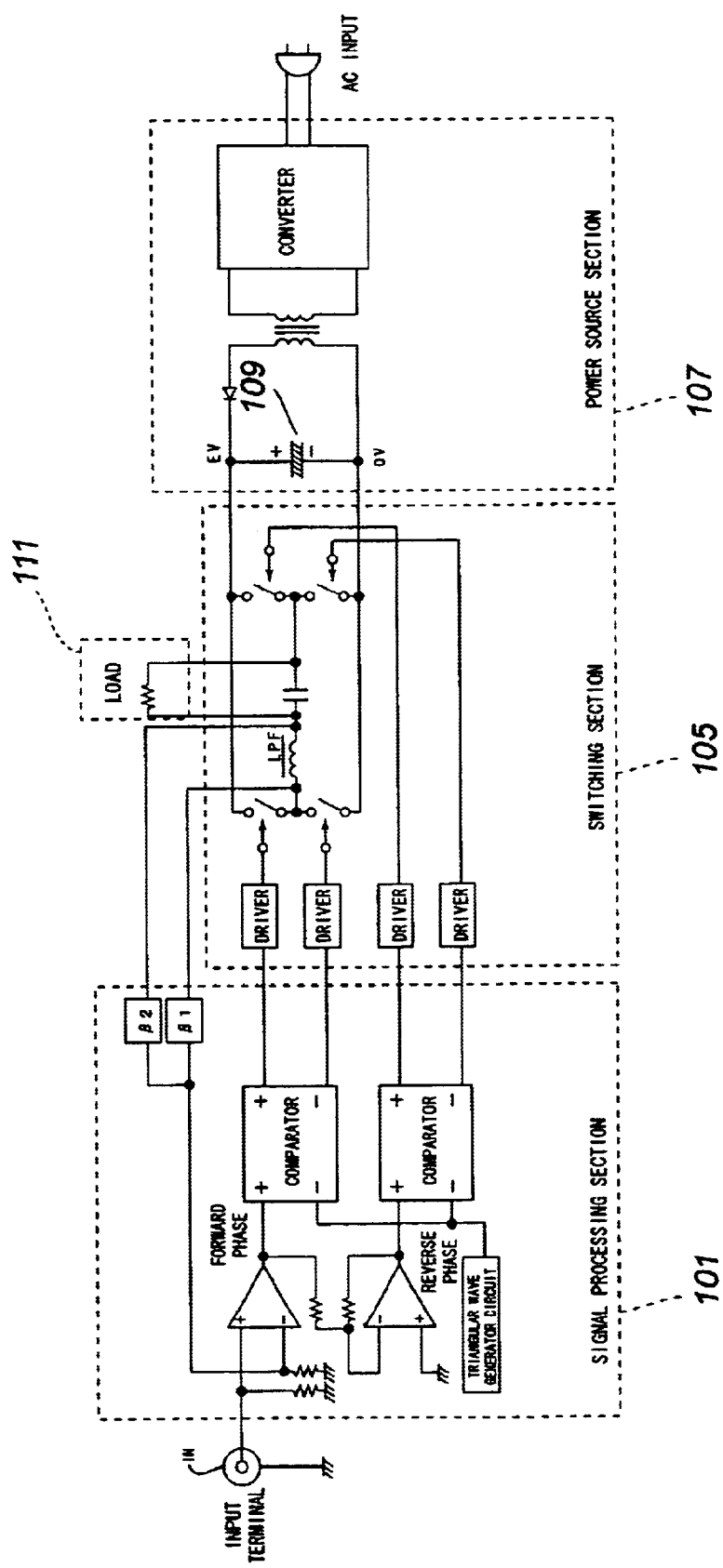
FIG. 4 is a block diagram showing a schematic configuration of a conventional-schemed 1-bit digital power amplifier having a single power source constituting output unit.

Explanation will be now made on another embodiment with reference to FIG. 3.

FIG. 3 shows an embodiment of a digital power amplifier in a parallel-operation current addition type. A plurality of digital power amplifiers, three digital power amplifiers A1, A2, A3 in FIG. 3, are connected in parallel with one another. Each of the digital power amplifiers A1, A2, A3 is same in basic configuration as that shown in FIG. 1.

Each digital power amplifier A1, A2, A3 has a signal processing circuit 101, an isolation section 103, a switching section 105 and a power source section 107. An LPF capacitor 59 is connected to the load connecting section (1), (2) as an output section of the digital power amplifier A1, A2, A3, wherein connection is made such that the LPF capacitor 59 and one load 9 are connected in parallel. In this case, the sum of the currents flowing the load connecting section flow through the load 9. Namely, by connecting a plurality of the digital power amplifiers having the same circuit configuration, it is possible to design a system having parallel-operation current addition type digital power amplifier capable of obtaining an output in a magnitude of multiple times.

However, differently from the configuration of FIG. 1, configuration is made to provide the load 9, in series, with a resistance Rs having a smaller value than the load 9 so that the current flowing the load 9 through an operational amplifier 203 is fed back to the operational amplifier 201. Namely, a constant-current output digital power amplifier is provided.

The digital power amplifiers A1, A2, A3 have respective input sections (3), (4) connected in parallel with one another. In front of the input sections (3), (4) connected in parallel, an input amplifier 205 is structurally provided so that voltage feed back can be made entirely through the parallel-connected output sections (1), (2) thereby outputting a constant voltage. In this case, the voltage Vo on the load 9 is given as $Vo = Vi \cdot (1 + R_2/R_1)$.

By these configurations, stable power amplification can be achieved.

Incidentally, the operation timing of the digital power amplifiers A1, A2, A3 may be given by synchronization due to a known control circuit configuration, e.g. by making common the triangular wave generator circuits, which will be omittedly explained herein. Meanwhile, a part or the entire, power source section 7, may be properly made common.

In this manner, in the embodiment shown in FIG. 3, it is possible to provide a high-output digital power amplifier compatible with high power by the use of general-purpose power semiconductor devices without the necessity to newly develop a semiconductor device for high-power applications.

For the use on a vehicle, the power source (battery) is DC 14V and is a low voltage. In order to raise power-amplifier power, a boosting DC-DC converter for raising the normal voltage is added This, however, results in a defect of efficiency worsening and size and cost increase. However, in the case of using the parallel-operation current addition type digital power amplifier, an extremely small-sized, high performance vehicular digital audio amplifier can be made without worsening the efficiency nor causing heat generation by adding a digital power amplifier unit.

Although the described embodiments explained on the case of application to the digital audio amplifier for driving a speaker, it is needless to say that the invention is not limited to this and can be applied to an arbitrary digital power amplifier.

As explained above, the invention can provide a digital power amplifier that can reduce the size of a digital audio amplifier, together with increase in output and consumption power decrease, and cope with large power by the use of general-purpose power semiconductor devices.

Explaining in detail, the exterior size of digital power amplifier according to the invention can be largely reduced, down to approximately 1/10 to 1/20 as compared to a conventional analog power amplifier of the same output in spontaneous air-cooled scheme, and down to approximately 1/3 to 1/5 as compared to a conventional digital power amplifier of the same output.

Meanwhile, the digital power amplifier of the invention can realize a total conversion efficiency of from AC input into SP output of around 85% that is the highest in the world. In the current situation, it is around 30% in the conventional analog power amplifier and around 65% in the conventional digital power amplifier. Thus, the conversion efficiency in the digital power amplifier of the invention is epoch making.

What is claimed is:

1. A digital power amplifier comprising:
   four switches SW1, SW2, SW3 and SW4 connected in a bridge arrangement;
   a load connecting section provided between a connection point of adjacent switches SW1 and SW2 and a connection point of adjacent switches SW3 and SW4 to connect a load;
   a power source connecting section provided between a connection point of adjacent switches SW1 and SW4 and a connection point of adjacent switches SW2 and SW3 to apply a voltage;

a grounding section grounding the connection point of the adjacent switches SW3 and SW4;

signal processing unit for converting an input signal into a 4-line digital signal;

driving unit for controlling opening-and-closing drive of the switches SW1, SW2, SW3 and SW4 according to a digital signal supplied from the signal processing unit;

isolating unit for electrically isolating between the signal processing unit and the driving unit; and feed-back unit for feeding back a signal at the connection point of the adjacent switches SW1 and SW2 to the signal processing unit.

2. A digital power amplifier according to claim 1, wherein the isolating unit is a photo-coupler.

3. A digital power amplifier wherein the digital power amplifier of claim 1 is provided with a resistance having a value smaller than the load in series with the load connecting section, and changed into a constant-current-output digital power amplifier for feeding back a current flowing through the load to an input side, a plurality of which are connected in parallel with one another.

4. A digital power amplifier wherein the digital power amplifier of claim 2 is provided with a resistance having a value smaller than the load in series with the load connecting section, and changed into a constant-current-output digital power amplifier for feeding back a current flowing through the load to an input side, a plurality of which are connected in parallel with one another.

5. A digital power amplifier wherein the constant-current-output digital power amplifiers of claim 3 are connected at inputs and outputs into parallel connection, an input amplifier being provided in front of an input section of the parallel connection to feed back a voltage at an output section of the parallel connection to an entirety.

6. A digital power amplifier wherein the constant-current-output digital power amplifiers of claim 4 are connected at inputs and outputs into parallel connection, an input amplifier being provided in front of an input section of the parallel connection to feed back a voltage at an output section of the parallel connection to an entirety.

* * * * *